(12) United States Patent
Meiser et al.

(10) Patent No.: US 9,799,762 B2
(45) Date of Patent: Oct. 24, 2017

(54) SEMICONDUCTOR DEVICE AND METHOD OF MANUFACTURING A SEMICONDUCTOR DEVICE

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/692,059

(22) Filed: Dec. 3, 2012

(65) Prior Publication Data
US 2014/0151798 A1 Jun. 5, 2014

(51) Int. Cl.
*H01L 29/78* (2006.01)
*H01L 29/40* (2006.01)
(Continued)

(52) U.S. Cl.
CPC ........ *H01L 29/7816* (2013.01); *H01L 29/404* (2013.01); *H01L 29/407* (2013.01);
(Continued)

(58) Field of Classification Search
CPC . H01L 29/402; H01L 29/407; H01L 29/4236; H01L 29/7816; H01L 29/66681;
(Continued)

(56) References Cited

U.S. PATENT DOCUMENTS 5,828,101 A 10/1998 Endo et al.
6,353,252 B1* 3/2002 Yasuhara ............ H01L 21/763
257/487
(Continued)

FOREIGN PATENT DOCUMENTS

CN 101185169 A 5/2008
CN 101419981 A 4/2009
(Continued)

OTHER PUBLICATIONS

Schloesser, T., et al. "Semiconductor Device and Method for Manufacturing a Semiconductor Device." U.S. Appl. No. 13/627,215, filed Sep. 26, 2012.
(Continued)

*Primary Examiner* — Cheung Lee
*Assistant Examiner* — Stephen C Smith
(74) *Attorney, Agent, or Firm* — Murphy, Bilak & Homiller, PLLC

(57) ABSTRACT

A semiconductor device comprises a transistor formed in a semiconductor substrate having a first main surface. The transistor includes a source region, a drain region, a channel region, a drift zone, and a gate electrode being adjacent to the channel region. The gate electrode is configured to control a conductivity of a channel formed in the channel region, the channel region and the drift zone are disposed along a first direction between the source region and the drain region, the first direction being parallel to the first main surface. The channel region has a shape of a first ridge extending along the first direction, and the transistor includes a first field plate arranged adjacent to the drift zone.

17 Claims, 10 Drawing Sheets

(51) Int. Cl.
*H01L 29/66* (2006.01)
*H01L 29/417* (2006.01)
*H01L 29/08* (2006.01)
*H01L 29/10* (2006.01)

(52) U.S. Cl.
CPC .. *H01L 29/66696* (2013.01); *H01L 29/66704* (2013.01); *H01L 29/7825* (2013.01); *H01L 29/0856* (2013.01); *H01L 29/0873* (2013.01); *H01L 29/1095* (2013.01); *H01L 29/41766* (2013.01)

(58) Field of Classification Search
CPC ... H01L 29/404; H01L 29/513; H01L 29/511; H01L 29/66696; H01L 29/66704; H01L 29/7825; H01L 29/0856; H01L 29/0873; H01L 29/1095; H01L 29/41766
See application file for complete search history.

(56) References Cited

U.S. PATENT DOCUMENTS

| | | | |
|---|---|---|---|
| 6,452,231 B1 * | 9/2002 | Nakagawa | H01L 27/0623 257/335 |
| 6,525,375 B1 | 2/2003 | Yamaguchi et al. | |
| 6,589,845 B1 * | 7/2003 | Nair et al. | 438/268 |
| 6,670,673 B2 | 12/2003 | Sakakibara | |
| 6,696,323 B2 * | 2/2004 | Yamaguchi | H01L 29/66348 257/E21.384 |
| 7,126,166 B2 * | 10/2006 | Nair et al. | 257/110 |
| 7,132,333 B2 | 11/2006 | Schloesser et al. | |
| 7,368,777 B2 | 5/2008 | Kocon | |
| 7,423,325 B2 * | 9/2008 | Tihanyi | H01L 29/0634 257/368 |
| 7,635,893 B2 | 12/2009 | Weis et al. | |
| 7,642,597 B2 | 1/2010 | Saito | |
| 7,714,384 B2 * | 5/2010 | Seliskar | 257/331 |
| 7,820,517 B2 * | 10/2010 | Gammel et al. | 438/301 |
| 7,964,913 B2 | 6/2011 | Darwish | |
| 8,115,253 B2 * | 2/2012 | Tang | H01L 29/66704 257/288 |
| 8,415,711 B2 * | 4/2013 | Kitagawa | H01L 29/0626 257/139 |
| 2001/0045599 A1 | 11/2001 | Hueting et al. | |
| 2002/0155685 A1 | 10/2002 | Sakakibara et al. | |
| 2003/0132463 A1 | 7/2003 | Miyoshi | |
| 2005/0156234 A1 | 7/2005 | Gammel et al. | |
| 2006/0076621 A1 * | 4/2006 | Hirler | H01L 29/0634 257/343 |
| 2006/0145230 A1 | 7/2006 | Omura et al. | |
| 2006/0202272 A1 * | 9/2006 | Wu | H01L 29/7787 257/355 |
| 2006/0237781 A1 | 10/2006 | Marchant et al. | |
| 2007/0221992 A1 | 9/2007 | Seliskar et al. | |
| 2008/0003703 A1 | 1/2008 | Gammel et al. | |
| 2009/0020852 A1 | 1/2009 | Harada et al. | |
| 2009/0108343 A1 | 4/2009 | Nemtsev et al. | |
| 2009/0114968 A1 | 5/2009 | Wang et al. | |
| 2009/0256212 A1 | 10/2009 | Denison et al. | |
| 2009/0267116 A1 * | 10/2009 | Wu et al. | 257/194 |
| 2009/0283825 A1 | 11/2009 | Wang et al. | |
| 2010/0176421 A1 | 7/2010 | Van Hove et al. | |
| 2010/0201439 A1 | 8/2010 | Wu et al. | |
| 2010/0327349 A1 | 12/2010 | Arie et al. | |
| 2011/0018058 A1 | 1/2011 | Disney et al. | |
| 2011/0169075 A1 | 7/2011 | Hsieh | |
| 2012/0043638 A1 * | 2/2012 | Kitagawa | H01L 29/407 257/488 |
| 2012/0061753 A1 | 3/2012 | Nishiwaki | |
| 2012/0074460 A1 * | 3/2012 | Kitagawa | H01L 29/0626 257/139 |
| 2012/0199878 A1 | 8/2012 | Shrivastava et al. | |
| 2012/0211834 A1 | 8/2012 | Yang et al. | |
| 2013/0037853 A1 | 2/2013 | Onozawa | |

FOREIGN PATENT DOCUMENTS

| | | |
|---|---|---|
| CN | 102007584 A | 4/2011 |
| CN | 102157493 A | 8/2011 |
| DE | 19818300 C1 | 7/1999 |
| DE | 102004056772 B4 | 1/2007 |
| DE | 102007040066 A1 | 3/2008 |
| JP | 2001274398 A | 10/2001 |
| JP | 2012089826 A | 5/2012 |

OTHER PUBLICATIONS

Vielemeyer, et al. "Integrated Circuit and Method of Manufacturing an Integrated Circuit." U.S. Appl. No. 14/043,971, filed Oct. 2, 2013.

Meiser, A., et al. "Semiconductor Device and Method of Manufacturing a Semiconductor Device." U.S. Appl. No. 13/731,380, filed Dec. 31, 2012.

Meiser, A., et al. "Semiconductor Device Including a Fin and a Drain Extension Region and Manufacturing Method." U.S. Appl. No. 13/692,462, filed Dec. 3, 2012.

* cited by examiner

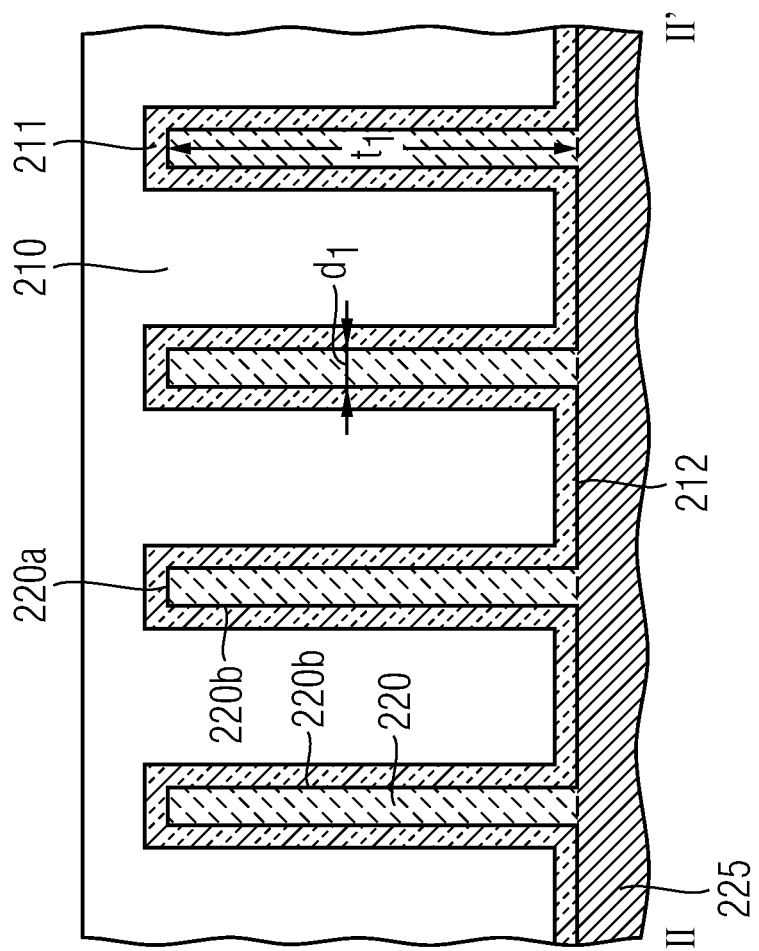

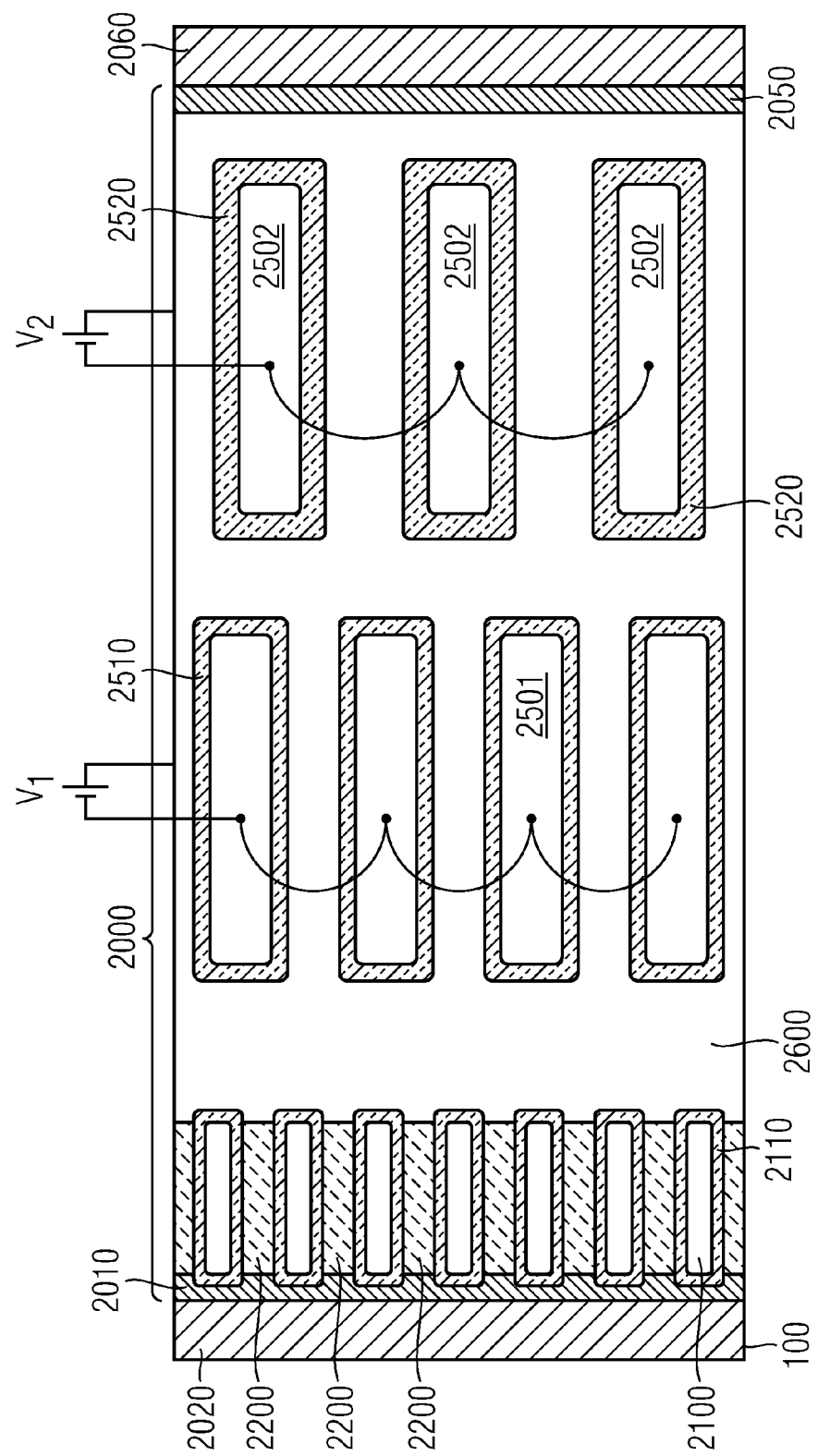

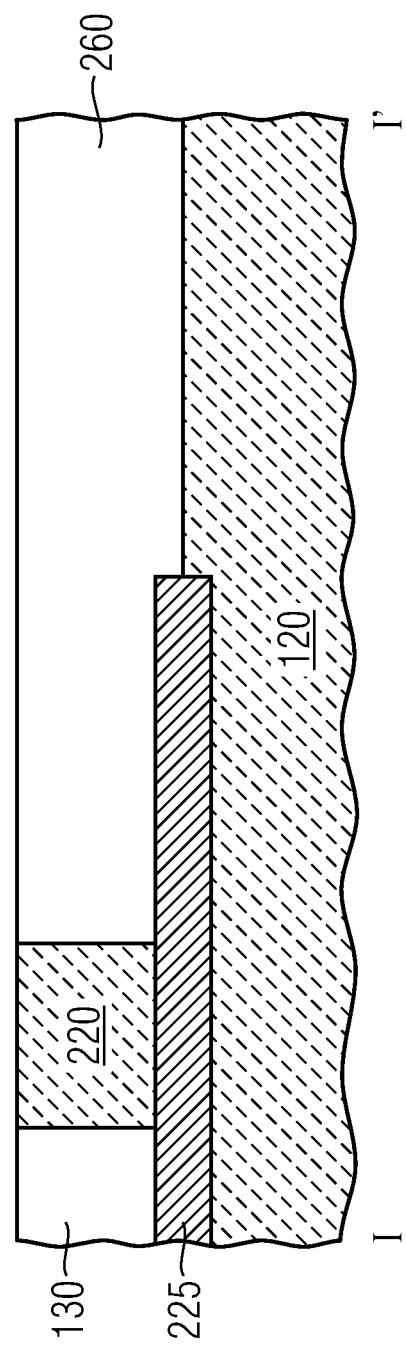

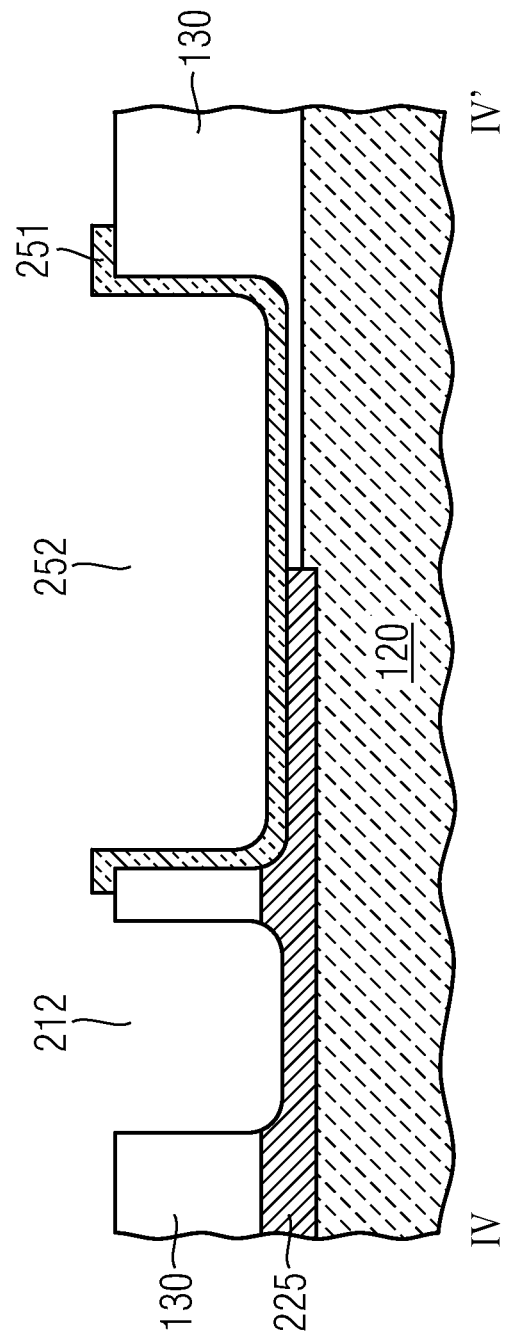

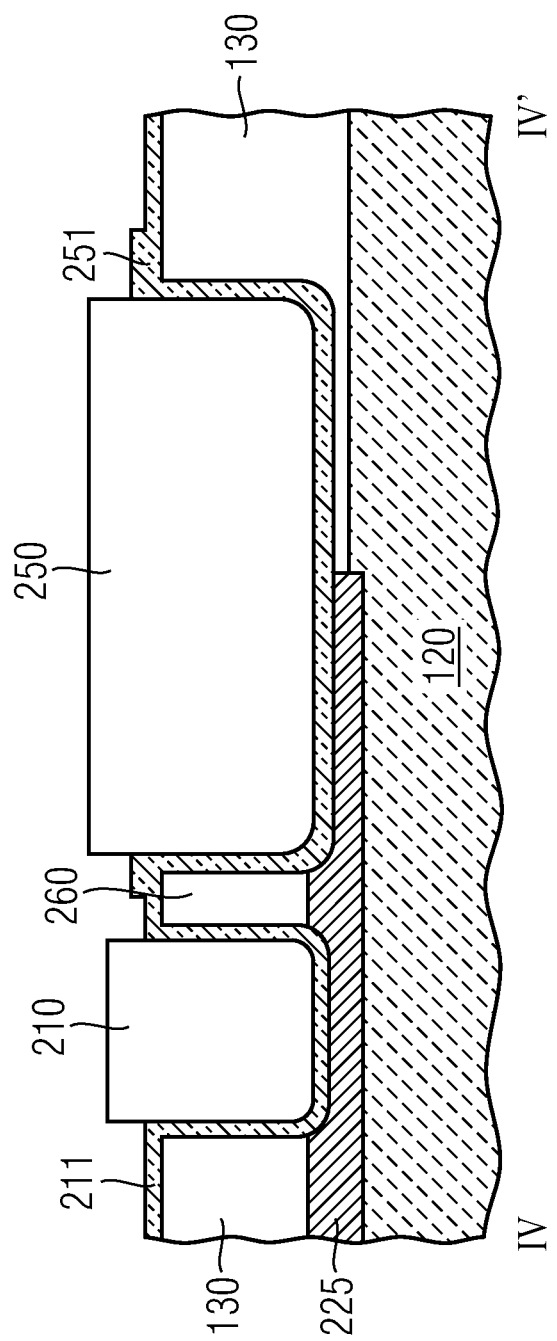

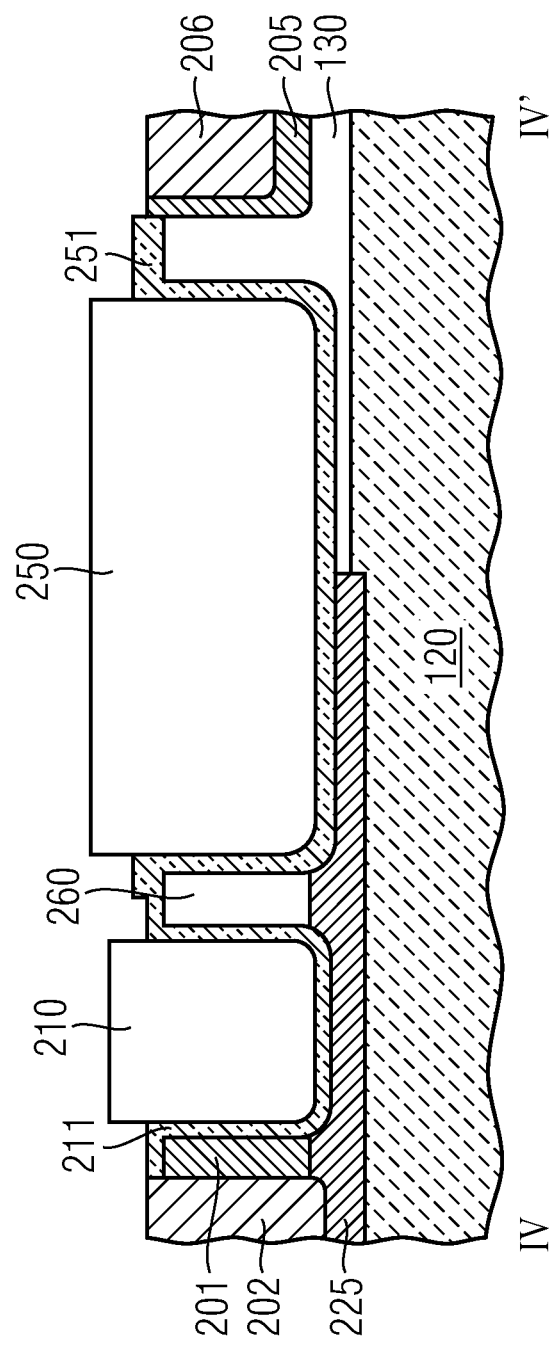

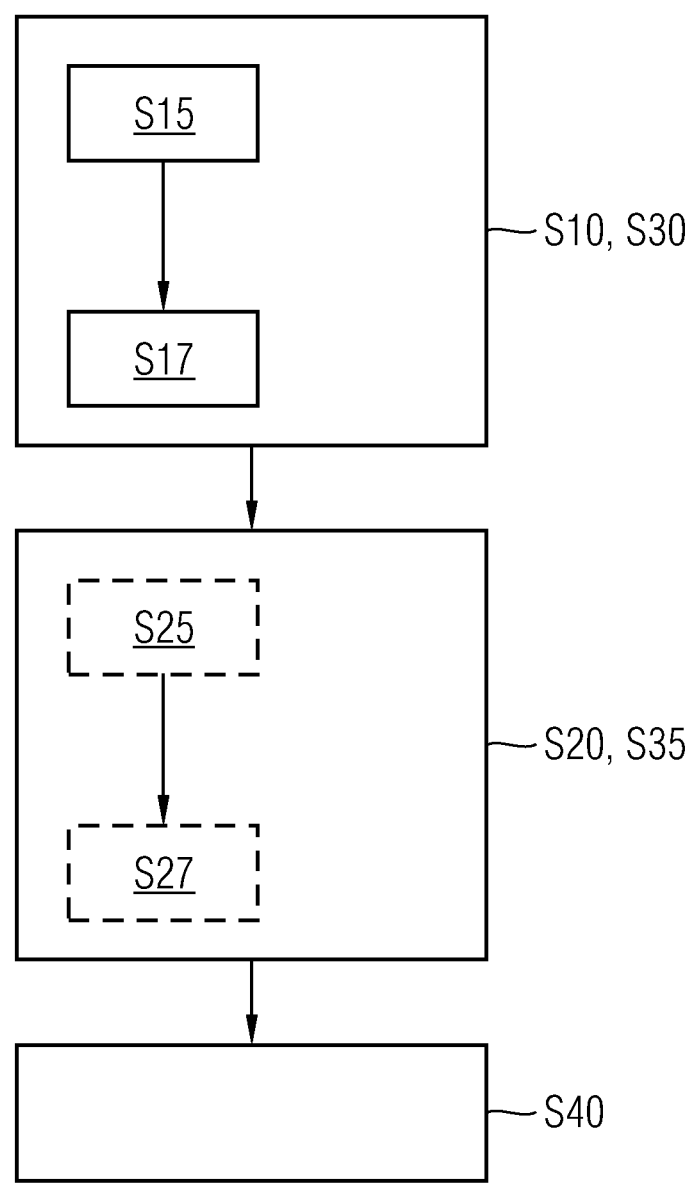

SEMICONDUCTOR DEVICE AND METHOD OF MANUFACTURING A SEMICONDUCTOR DEVICE

TECHNICAL FIELD

The present specification relates to a semiconductor device and a method of manufacturing a semiconductor device.

BACKGROUND

MOS power transistors or MOS power devices which are commonly employed in automotive and industrial electronics, should have a low switch-on resistance ($R_{on}$), when being switched on. In a switch-off state, they should have a high breakdown voltage characteristic and withstand source-drain voltages. For example, a MOS power transistor should withstand a drain to source voltage $V_{ds}$ of some tens to some hundreds volts when being switched off. As a further example, MOS power transistors conduct a very large current which may be up to some hundreds of amperes at a gate-source voltage of about 2 to 20 V at a low voltage drop $V_{ds}$.

According to commonly employed technologies, lateral MOS transistors are used, which comprise a drain extension region or which are based on the so-called resurf concept. According to the resurf concept, in an off-state charges are removed by a doped portion which is disposed beneath the drift region. Alternatively, this doped portion may be implemented as an electrode disposed over the drift region and being insulated from the drift region. In order to further reduce the $Rds_{on}$ and the parasitic capacitances, new concepts for implementing a transistor are being searched for.

SUMMARY

According to an embodiment, a semiconductor device, formed in a semiconductor substrate, includes a first main surface and a transistor. The transistor comprises a source region, a drain region, a channel region, a drift zone, and a gate electrode adjacent to the channel region, the gate electrode configured to control a conductivity of a channel formed in the channel region. The channel region and the drift zone are disposed along a first direction between the source region and the drain region, the first direction being parallel to the first main surface. The channel region has a shape of a first ridge extending along the first direction. The transistor further comprises a first field plate being arranged adjacent to the drift zone.

According to a further embodiment, a semiconductor device, formed in a semiconductor substrate, includes a first main surface and a transistor. The transistor comprises a source region, a drain region, a channel region, a drift zone, and a gate electrode adjacent to the channel region, the gate electrode configured to control a conductivity of a channel formed in the channel region. The channel region and the drift zone are disposed along a first direction between the source region and the drain region, the first direction being parallel to the first main surface. The channel region has a shape of a first ridge extending in the first direction, the first ridge having a first width $d_1$ with: $d_1 \leq 2 \times l_d$, wherein $l_d$ denotes a length of a depletion zone formed at an interface between the first ridge and a gate dielectric, the gate dielectric disposed between the first ridge and the gate electrode.

According to a further embodiment, a method of manufacturing a semiconductor device in a semiconductor substrate, the semiconductor substrate comprising a first main surface and a transistor, is described. According to the method, forming the transistor comprises forming a source region, a drain region, a channel region, a drift zone and a gate electrode adjacent to the channel region, wherein the channel region and the drift zone are formed so as to be disposed along a first direction between the source region and the drain region, the first direction being parallel to the first main surface. Forming the channel region comprises forming a first ridge in the semiconductor substrate, the first ridge extending along the first direction, the first ridge having a first width $d_1$ with: $d_1 \leq 2 \times l_d$, wherein $l_d$ denotes a length of a depletion zone formed at an interface between the first ridge and a gate dielectric, the gate dielectric disposed between the first ridge and the gate electrode.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1C shows a cross-sectional view of the semiconductor device according to an embodiment, taken along a direction perpendicular to the direction along which the cross-sectional view of FIG. 1B is taken;

FIG. 2 shows a plan view of a semiconductor device according to a further embodiment;

FIGS. 3A to 3D show cross-sectional views of a semiconductor substrate while performing processing methods of a manufacturing method; and FIGS. 4A and 4B schematically show flow diagrams illustrating steps for manufacturing a semiconductor device according to embodiments.

DETAILED DESCRIPTION

Figure 1A:
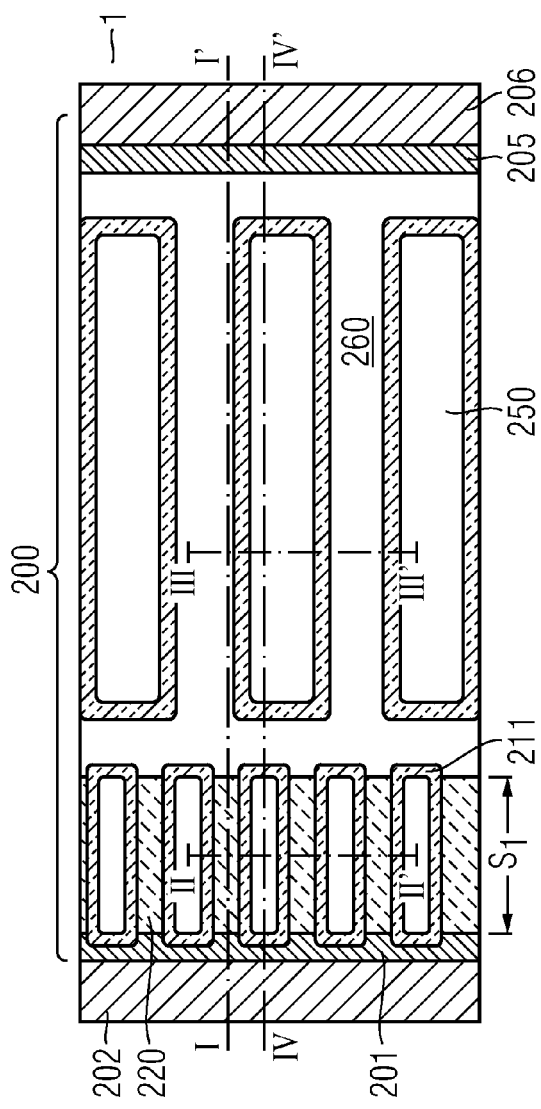
FIG. 1A shows a plan view of an example of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The figures and the description illustrate relative doping concentrations by indicating "−" or "+" next to the doping type "n" or "p". For example, "n" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Figure 1B:
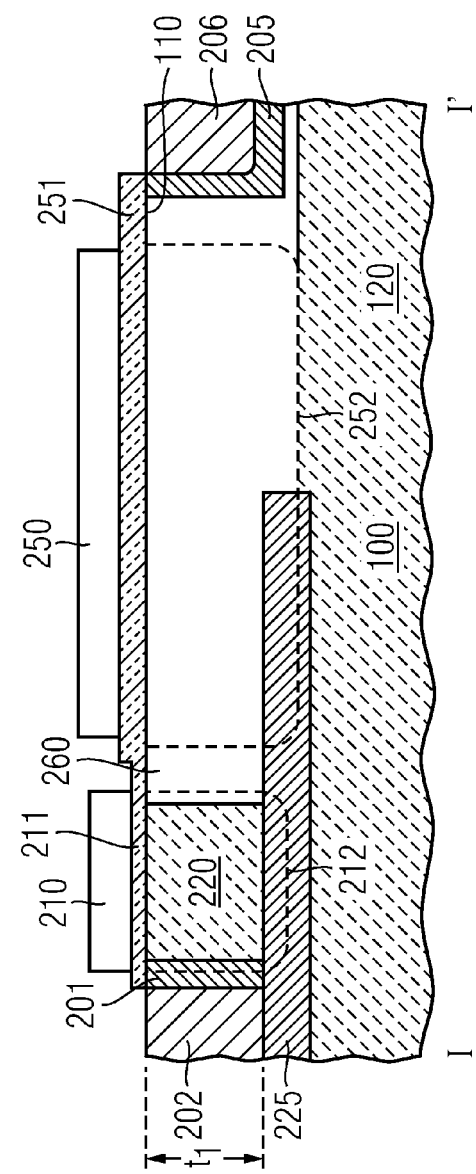
FIG. 1B shows a cross-sectional view of the semiconductor device shown in FIG. 1A.

FIG. 1A shows a plan view of a semiconductor device according to an embodiment, and FIG. 1B shows a cross-sectional view of the semiconductor device which is taken between I and I'.

The semiconductor device shown in FIG. 1 comprises a source region 201, a drain region 205, a channel region 220, and a drift zone 260. The source region 201, the drain region 205, and the drift zone 260 may be doped with dopants of a first conductivity type, for example n-type dopants. The doping concentration of the source and drain region 201, 205 may be higher than a doping concentration of the drift zone 260. The channel region 220 is arranged between the source region 201 and the drift zone 260. The channel region 220 is doped with a dopant of a second conductivity type, for example, p-doped. The drift zone 260 may be arranged between the channel region 220 and the drain region 205. The source region 201, the channel region 220, the drift zone 260 and the drain region 205 are disposed along a first direction.

When a suitable voltage is applied to the gate electrode 210, the conductivity of a channel that is formed in the channel region 220 will be controlled by the gate voltage. The gate electrode 210 is insulated from the channel region 220 by means of an insulating gate dielectric material 211 such as silicon oxide. By controlling the conductivity of a channel formed in the channel region 220, the current flow from the source region 201 via the channel formed in the channel region 220 and the drift zone 260 to the drain region 205 may be controlled.

The source region 201 is connected to the source electrode 202. The drain region 205 is connected to the drain electrode 206.

The arrangement shown in FIG. 1A implements a semiconductor device 1 comprising a transistor 200 that is formed in a semiconductor substrate 100 having a first main surface 110. According to an embodiment, the transistor 200 may further comprise a field plate 250 which is arranged adjacent to the drift zone 260. The field plate 250 is insulated from the drift zone 260 by means of an insulating field dielectric layer 251 such as a field oxide. When being switched on, an inversion layer is formed at the boundary between the channel region 220 and the insulating gate dielectric material 211. Accordingly, the transistor 200 is in a conducting state from the source region 201 to the drain region 205 via the drift zone 260. When the transistor 200 is switched off, no conductive channel is formed at the boundary between the channel region 220 and the insulating gate dielectric material 211 so that no current flows. Further, an appropriate voltage may be applied to the field plate 250 in an off-state. In an off-state the field plate 250 depletes charge carriers from the drift zone 260 so that the reverse voltage characteristics of the semiconductor device are improved. In a semiconductor device comprising a field plate, the doping concentration of the drift zone 260 may be increased without deteriorating the reverse voltage characteristics in comparison to a device without a field plate. Due to the higher doping concentration of the drift zone 260, the on-resistance $Rds_{on}$ is further decreased resulting in improved device characteristics.

FIG. 1B shows a cross-sectional view of the semiconductor device 1 illustrated in FIG. 1A between I and I'. The direction between I and I' corresponds to the first direction. As is shown, the source region 201 extends from the main surface 110 into a depth direction of the substrate 100, i.e.

perpendicularly with respect to the main surface 110. The channel region 220 and the drift zone 260 are disposed along a first direction which is parallel to the first main surface 110 between the source region 201 and the drain region 205. The drain region 205 likewise extends from the first main surface 110 in a depth direction of the substrate. As is indicated by dotted lines, in a plane before and behind the depicted plane of the drawing, gate trenches 212 are disposed adjacent to the channel region 220. In a corresponding manner, field plate trenches 252 may be disposed adjacent to the drift zone 260. The gate trench 212 and the field plate trench 252 extend from the first main surface 110 in a depth direction of the substrate. As a consequence, the channel region 220 has the shape of a first ridge. Due to the presence of the field plate trenches 252, also the drift zone 260 has the shape of a second ridge. FIG. 1B further shows a body connect implantation region 225 that is disposed beneath the body region 220 and beneath a part of the drift zone 260. The body connect implantation region 225 connects the channel region 220 to the source contact 202 so as to avoid a parasitic bipolar transistor which could be otherwise formed at this portion. Moreover, the body connect implantation region 225 extends beneath the drift zone 260 so that in an off-state of the transistor 200, the drift zone 260 may be depleted more easily.

Figure 1D:
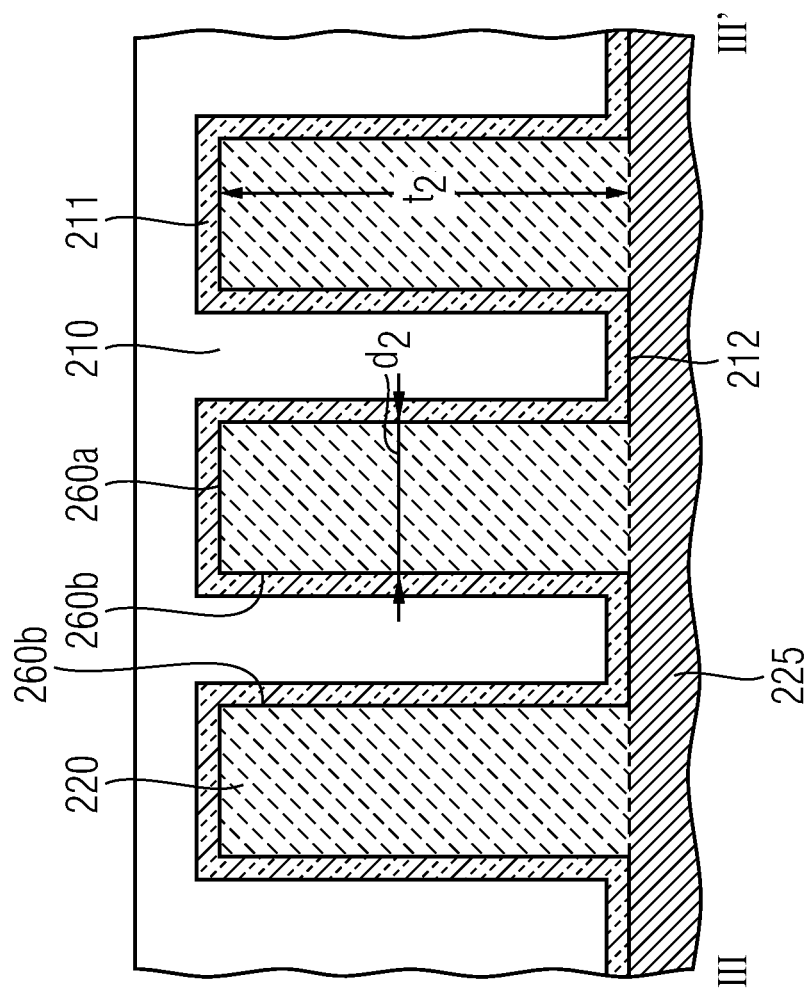
FIG. 1D shows a further cross-sectional view of the semiconductor device, taken along a direction perpendicular to the direction along which the cross-sectional view of FIG. 1B is taken.

FIGS. 1C and 1D illustrates cross-sectional views of the substrate which are taken between II and II' and III and III' in FIG. 1A. The directions between II and II' and between III and III' are perpendicular to the first direction. As is shown in FIG. 1C, the channel region 220 has the shape of a ridge, the ridge having a width $d_1$ and a depth or height $t_1$. For example, the first ridge may have a top side 220a and two sidewalls 220b. The sidewalls 220b may extend perpendicularly or at an angle of more than 75° with respect to the first main surface 110. The gate electrode 210 may be disposed adjacent to at least two sides of the ridge.

Moreover, in a cross-sectional view between III and III', the drift zone 260 also has the shape of a second ridge, the second ridge having a width $d_2$ and a depth or height $t_2$. For example, the second ridge may have a top side 260a and two sidewalls 260b. The sidewalls 260b may extend perpendicularly or at an angle of more than 75° with respect to the first main surface 110. The drift zone 260 may be disposed adjacent to the top side 260a or adjacent to at least two sides of the ridge.

Beneath each of the ridges, the deep body connect implant region 225 is disposed, which will be explained hereinafter. A gate dielectric layer 211 is disposed between the gate electrode 210 and the channel region 220. In a similar manner, the field dielectric layer 251 is disposed between the field plate 250 and the drift zone 260.

According to an embodiment, the width $d_1$ of the channel region 220 is: $d_1 \leq 2 \times l_d$, wherein $d_1$ denotes a length of a depletion zone which is formed at the interface between the gate dielectric layer 211 and the channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9*$\varepsilon_0$ for silicon), k denotes the Boltzmann constant (1.38066*10⁻²³ J/K), T denotes the temperature, ln denotes the natural logarithm, $N_A$ denotes the impurity concentration of the semiconductor body, $n_i$ denotes the intrinsic carrier concentration (1.45*10¹⁰ for silicon at 27° C.), q denotes the elementary charge (1.6*10⁻¹⁹ C).

Generally, it is assumed that in a transistor, the length of the depletion zone at a gate voltage corresponding to the threshold voltage corresponds to the maximum width of the depletion zone. For example, the width of the first trenches may be approximately 20-130 nm, for example, 40-120 nm along the first main surface 110 of the semiconductor substrate 100.

Moreover, the ratio of length to width may fulfill the following relationship: $s_1/d_1 > 2.0$, wherein $s_1$ denotes the length of the ridge measured along the first direction, as is also illustrated in FIG. 1A. According to further embodiments, $s_1/d_1 > 2.5$. As is shown in FIGS. 1C and 1D, the width $d_1$ of the channel region 220 may be different from the width $d_2$ of the drift zone 260. According to a further embodiment, the drift zone 260 may comprise a flat surface which is not patterned to form ridges as is shown in FIG. 1D.

According to the embodiment in which the width $d_1 \leq 2 \times l_d$, the transistor 200 is a so-called "fully depleted" transistor in which the channel region 220 is fully depleted when the gate electrode is set to an on-potential. In such a transistor, an optimal sub-threshold voltage can be achieved and short channel effects may be efficiently suppressed, resulting in improved device characteristics.

In a transistor comprising a field plate, on the other hand, it is desirable to use a drift zone 260 having a width $d_2$ which is much larger than the width $d_1$. Due to the larger width of the drift zone $d_2$, the resistance $Rds_{on}$ of the drift zone 260 may be further decreased, resulting in further improved device characteristics. In order to improve the characteristics of the semiconductor device in the body region 220 and to further improve the device characteristics in the drift zone 260, patterning the gate electrode and the field plate 250 is accomplished so as to provide a different width of the first and second ridges.

As has further been discussed with reference to FIG. 1B, the source and the drain region 201, 205 extend in the depth direction of the substrate. Accordingly, by appropriately setting the depth of the source and drain region 201, 205, the electric properties of the transistors may be set in accordance with the requirements. Due to the special additional feature that the gate electrode 210 and the field plate 250 extend in the depth direction adjacent to the channel region 220 and the drift zone 260, it is possible to control the conductivity of a channel that is formed in the channel region 220 by means of the gate electrode along the full depth $t_1$ of the channel region 220. In a corresponding manner, the field plate 250 influences the behavior of the drift zone 260 along the depth $t_2$ of the second ridge. Therefore, the depth of the source region 201 and the drain region 205 determine the effective width of the transistor 200. By setting the depth of the source and the drain regions 201, 205 the width and, consequently, the characteristics of the device may be determined. For example, the depth of the source and the drain regions 201, 205 may be larger than 1 μm.

Generally, when being operated in an on-state, a conductive inversion layer is formed in the channel region 220 adjacent to the gate dielectric layer 211. According to an embodiment, the inversion layer extends along at least one of the two sidewalls 220b and 220a current flows mostly parallel to the first main surface 110.

As is illustrated in FIGS. 1C and 1D, the gate electrode may be disposed at at least two sides of the ridge. According to a further embodiment, the gate electrode may be disposed along the two vertical sides of the ridge, whereas no gate electrode is disposed adjacent to the horizontal portion of the ridge. In a similar manner, the field plate 250 may be disposed at three sides of the drift zone 260. Nevertheless, according to an embodiment, the field plate 250 may be disposed adjacent to only the vertical portions of the drift zone 260. According to the embodiment shown in FIG. 1, the gate electrode 210 and the field plate 250 are separated from each other.

According to an embodiment, the doping concentration within the drift zone 260 may be constant. According to a further embodiment, the doping concentration may increase with increasing distance from the source region 201. Further, the thickness of the gate dielectric layer 211 may be less than a thickness of the field plate dielectric layer 251. The thickness of the field plate dielectric layer 251 may be constant or may increase with increasing distance from the source region 201. Moreover, the thickness of the field plate dielectric layer 251 adjacent to the horizontal surface of the ridge may be different from a thickness of the field plate dielectric layer 251 adjacent to a vertical portion of the ridge. For example, the thickness of the vertical portion of the field plate dielectric layer 251 may be greater than a horizontal portion of the field plate dielectric layer 251. The semiconductor device shown in FIG. 1 may further comprise contacts which extend to the first main surface 110 of the semiconductor substrate 100. According to a further embodiment, the semiconductor device may further comprise contacts to a second main surface which is opposite to the first main surface 110 of the semiconductor substrate 100. According to an embodiment, the source contact 202 that is electrically coupled to the source region 201, may extend to the first main surface 110 and the drain electrode 206 that is electrically coupled to the drain region 205, may extend to the second main surface being opposite to the first main surface 110.

FIG. 2 shows a further embodiment of the semiconductor device. The semiconductor device 100 comprises a transistor 2000 including a source region 2010 connected to a source electrode 2020. The transistor 2000 further comprises a drain region 2050 connected to a drain electrode 2060. The transistor 2000 further comprises gate electrodes 2100 which are disposed adjacent to a channel region 2200 and which are insulated from the channel region 2200 by means of a gate dielectric layer 2110. The transistor 2000 further comprises a drift zone 2600 which is disposed adjacent to the channel region 2200. The source region 2010, channel region 2200, drift zone 2600 and drain region 2050 extend along a first direction.

The transistor 2000 further comprises a first field plate 2501 which is insulated from the drift zone 2600 by means of a first field plate dielectric 2510. Moreover, the transistor 2000 further comprises a second field plate 2502 which is insulated from the drift zone 2600 by means of a second field plate dielectric layer 2520. According to the embodiment shown in FIG. 2, the second field plate 2502 has a shape and construction which are different from the shape and construction of the first field plate 2501. For example, the drift zone 2600 may have the shape of a first ridge beneath the first field plate 2501 and a shape of a second ridge beneath the second field plate and the width of the first ridge is different from the width of the second ridge. For example, the width of the second ridge may be larger than the width of the first ridge. Moreover, the thickness of the second field plate dielectric 2520 may be different from the thickness of the first field plate dielectric 2510. For example, the thickness of the second field plate dielectric 2520 may be larger than the thickness of the first field plate dielectric 2510. Accordingly, many parameters may be different for the first and second field plate 2501, 2502. The first and second field plates 2501, 2502 may be held at different potentials V1, V2. As is clearly to be understood, according to an embodiment, the transistor 2000 may comprise more than two field plates.

FIGS. 3A to 3D illustrate steps of manufacturing a semiconductor device according to an embodiment.

A semiconductor substrate may be pre-processed by performing shallow trench isolation processes (STI) and implantation steps which are generally known. For example, a well implantation step may be performed so as to form a well implantation portion 120, followed by a further implantation step for providing a deep body connect implant region 225 and a doping step for forming the channel region 220. Further, an implantation step may be performed so as to define the drift zone 260. In the embodiment shown in FIG. 3A, the drift zone 260 is n-doped whereas the channel region 220 is p-doped. The deep body connect implantation region 225 is heavily p-doped. As is to be clearly understood, the reverse doping types may be applied.

FIG. 3A shows a cross-sectional view between I and I' which is shown in FIG. 1A. In the next step, gate trenches 212 and field plate trenches 252 are photolithographically defined and etched, optionally, using a hardmask. For example, the trenches may have a depth of approximately, 500 to 5000 nm. The distance between adjacent gate trenches 212 may be 30 to 300 nm, and the distance between adjacent field plate trenches 252 may be 200 to 2000 nm. The gate trenches 212 and the field plate trenches 252 are defined so as to pattern the channel region 220 and the drift zone 260 into first and second ridges. Thereafter, a field plate dielectric layer 251 is formed, for example, by a low pressure CVD method. For example, the field plate oxide layer may have a thickness of 30 to 500 nm. Thereafter, a photolithographical step may be performed so that the field oxide is etched from the unnecessary portions.

FIG. 3B shows a cross-sectional view of an example of a resulting structure. The cross-sectional view of FIG. 3B is taken between IV and IV as is shown in FIG. 1A. As is shown, the field plate trench 252 may extend to a deeper depth than the gate trenches 212. The field dielectric layer 251 is only formed in the field plate trench 252.

Thereafter, the gate dielectric layer 211 may be formed, for example by thermal oxidation. For example, the gate dielectric layer 211 may have a thickness of 5 to 50 nm. Then, a conductive material forming the gate electrode 210 and the field plate 250 is formed. For example, polysilicon may be deposited. For example, the polysilicon layer may have a thickness of 50 to 200 nm. The polysilicon material may be n-doped or may be undoped and may be doped after deposition. Then, the conductive material is patterned so as to form the gate electrode 210 and the field plate 250.

FIG. 3C shows an example of a resulting structure. As is shown, the gate electrode 210 is formed so as to be adjacent to the channel region 220 and the field plate 250 is disposed so as to be adjacent to the drift zone 260. Thereafter, contact trenches are defined so as provide connections to the source and drain regions 201, 205. For example, the contact trenches may be photolithographically defined and etched, optionally using a hard mask layer. Then, a tilted implantation step, for example, with n-type dopants, may be performed so as to form the source region 201 and the drain region 205. For example, the source region 201 and the drain region 205 may extend to different depths. For example, the source region 201 and the drain region 205 may extend to a depth of approximately 500 to 5000 nm. For example, any of the source region 201 and the drain region 205 may extend to approximately the same depth or less than the depth of the gate trenches 212. The term "approximately the same depth" is intended to mean that due to process induced variations, the depth of any of the source region 201 and the drain region 205 may be about 10% less than the depth of the gate trenches 212. Optionally, a further p⁺ implantation step may be performed to further dope the portions that are directly disposed beneath the channel region 220, to form the p⁺-doped body connect implantation region 225. This further p⁺ implantation step may be performed before or after defining the source and drain regions 201, 205. Then, conductive material for forming the source electrode 202 and the drain electrode 206 is filled in the contact trenches. For example, the conductive material may comprise polysilicon or a layer stack including Ti, TiN and tungsten (W). The conductive material may be etched back. Contacts may be formed and the further processing steps which are common for transistor manufacturing may be performed.

According to another embodiment, the tilted implantation step and the contact trench processing can be performed at a later processing stage, for example during the so-called MOL (mid-of-line) processing steps.

According to further embodiments, the contact trenches may be etched to a deeper depth than illustrated in FIG. 3D so as to provide a contact to the second main surface of the semiconductor device.

FIG. 3D shows an example of a resulting structure.

Figure 4A:
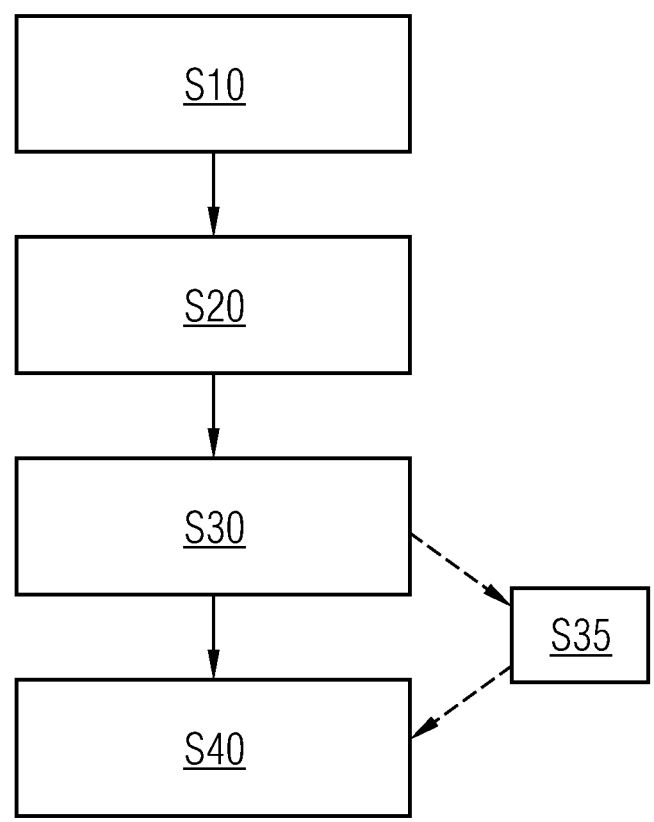

FIG. 4A illustrates a method of manufacturing a semiconductor device according to an embodiment. As is illustrated in FIG. 4A, the method may comprise forming a transistor in a semiconductor substrate, the semiconductor substrate comprising a first main surface, wherein forming a transistor comprises forming a source region (S40), a drain region (S40), a channel region (S10), a drift zone (S20) and a gate electrode (S30) adjacent to the channel region, wherein the channel region and the drift zone are formed so as to be disposed along a first direction, the first direction being parallel to the first main surface between the source region and the drain region, wherein the channel region is formed in a substrate portion having a shape of a first ridge extending along the first direction, the first ridge having a first width $d_1$ with: $d_1 \leq 2 \times l_d$, wherein $l_d$ denotes a length of a depletion zone formed at an interface between the gate electrode and the first ridge. Optionally, the method may further comprise forming a field plate (S 35). According to embodiments, the succession of the single processing methods may be varied and can be determined in accordance with general process requirements.

FIG. 4B illustrates a method of manufacturing a semiconductor device according to a further embodiment. According to the embodiment, a method of manufacturing a semiconductor device comprises forming a transistor in a semiconductor substrate, the semiconductor substrate comprising a first main surface, wherein forming a transistor comprises forming a source region (S40), a drain region (S40), a channel region (S10), a drift zone (S20) and a gate electrode (S30) adjacent to the channel region, wherein the channel region and the drift zone are formed so as to be disposed along a first direction, the first direction being parallel to the first main surface between the source region and the drain region. Forming the channel region (S10) may comprise defining a first ridge in the semiconductor substrate, the first ridge extending along the first direction. Defining the first ridge and forming the gate electrode (S30) may be accomplished by forming gate trenches (S15) in the semiconductor substrate and forming a conductive layer (S17) so as to fill adjacent trenches.

According to a further embodiment, forming the drift zone (S20) may comprise defining a second ridge in the semiconductor substrate, the second ridge extending along the first direction. Defining the second ridge and forming the field plate (S35) may be accomplished by forming field plate trenches (S25) in the semiconductor substrate and forming a conductive layer (S27) so as to fill adjacent trenches.

Forming the transistor by forming gate trenches and, optionally field plate trenches and, thereafter, forming a conductive layer so as to fill adjacent trenches, refers to the so-called damascene manufacturing method. According to this method, patterning the conductive layer so as to form the portions of the gate electrode adjacent to vertical sidewalls of the first ridge, can be dispensed with. Similarly, patterning the conductive layer so as to form the portions of the field plate adjacent to vertical sidewalls of the second ridge, can be dispensed with. Consequently, this method further simplifies the method of manufacturing the semiconductor device.

As has been illustrated in the foregoing, embodiments of the present specification relate to a semiconductor device which is implemented as a so-called lateral device enabling a current flow approximately parallel to the first main surface 110 of the semiconductor substrate 200. Accordingly, for example, source and drain regions may be formed in an easy manner and all device components may be processed adjacent to the first main surface 110 of the substrate. The channel region 220 has the shape of a ridge, thus implementing a three-dimensional structure. The gate electrode 210 is disposed in gate trenches 212 extending along the whole depth of the channel region 220. Accordingly, control of a conductive channel formed in the channel region 220 may be accomplished over the whole depth of the transistor. Moreover, due to the presence of the field plate 250, charge compensation in the drift zone 260 by means of the field plate 250 is accomplished. According to an embodiment, the field plate 250 is disposed in a field plate trench 252 extending in the depth direction of the substrate. Accordingly, in an off-state, depletion of charge carriers in the drift zone 260 with the field plate 250 may be easily and effectively accomplished. According to the embodiment in which the channel region 220 has the shape of a ridge having a special width, the transistor may be fully depleted when a gate voltage corresponding to an on-state is applied. Thereby, a transistor having improved sub-threshold slope characteristics is implemented. Further, the effective transistor width is increased, so that the effective area of the transistor is increased without increasing the space that is required.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor formed in a semiconductor substrate having a first main surface, the transistor comprising:
    a source region;
    a drain region;
    a channel region;
    a drift zone;
    a gate electrode adjacent to the channel region, the gate electrode configured to control a conductivity of a channel formed in the channel region, the gate electrode being disposed in gate trenches having a longitudinal axis extending in a first direction parallel to the first main surface, the channel region and the drift zone disposed along the first direction between the source region and the drain region, the channel region being patterned into a shape of a first ridge extending along the first direction by adjacent gate trenches, the transistor further comprising a source contact in contact with the source region, the source contact extending along a vertical direction along the source region, and being disposed in a contact trench extending in the semiconductor substrate adjacent to the source region, a longitudinal axis of the contact trench running in a second horizontal direction perpendicular to the first direction.

2. The semiconductor device according to claim 1, wherein the gate electrode is disposed at at least two sides of the ridge.

3. The semiconductor device according to claim 1, further comprising a doped semiconductor region below the source region, wherein the source contact extends to the doped semiconductor region.

4. The semiconductor device according to claim 1, wherein a portion of the drift zone has a shape of a second ridge extending along the first direction.

5. The semiconductor device according to claim 4, further comprising a field plate adjacent to the drift zone, wherein portions of the field plate are disposed at at least two sides of the second ridge.

6. The semiconductor device according to claim 4, wherein the second ridge has a width different from a width of the first ridge.

7. The semiconductor device according to claim 1, further comprising a drain contact in contact with the drain region, the drain contact extending along a vertical direction along the drain region.

8. A semiconductor device comprising a transistor formed in a semiconductor substrate having a first main surface, the transistor comprising:
   a source region;
   a drain region;
   a drain contact in contact with the drain region;
   a channel region;
   a drift zone;
   a gate electrode adjacent to the channel region, the gate electrode configured to control a conductivity of a channel formed in the channel region, the gate electrode being disposed in gate trenches extending in a first direction parallel to the first main surface, the channel region and the drift zone disposed along the first direction between the source region and the drain region, the channel region being patterned into a shape of a first ridge extending along the first direction by adjacent gate trenches, and
   a field plate adjacent to the drift zone, the field plate being arranged in field plate trenches, a longitudinal axis of the field plate trenches running in the first direction.

9. The semiconductor device according to claim 8, wherein the gate electrode is disposed at at least two sides of the ridge.

10. The semiconductor device according to claim 8, wherein the drain contact is disposed in a trench in the first main surface, adjacent to the drain region.

11. The semiconductor device according to claim 8, wherein a portion of the drift zone has a shape of a second ridge extending along the first direction, portions of the field plate being disposed at at least two sides of the second ridge.

12. A semiconductor device comprising a transistor formed in a semiconductor substrate having a first main surface, the transistor comprising:
   a source region;
   a drain region;
   a channel region;
   a drift zone;
   a gate electrode adjacent to the channel region, the gate electrode configured to control a conductivity of a channel formed in the channel region, the gate electrode being disposed in gate trenches extending in a first direction parallel to the first main surface, the channel region and the drift zone disposed along the first direction between the source region and the drain region, the channel region being patterned into a shape of a first ridge extending along the first direction by adjacent gate trenches,
   the transistor further comprising a source contact trench in the semiconductor substrate, a longitudinal axis of the source contact trench running in a second horizontal direction perpendicular to the first direction, a conductive material in the source contact trench being electrically coupled to the source region.

13. The semiconductor device according to claim 11, further comprising a field plate adjacent to the drift zone, wherein portions of the first field plate are disposed at at least two sides of the second ridge.

14. The semiconductor device according to claim 11, wherein the second ridge has a width different from a width of the first ridge.

15. The semiconductor device according to claim 12, wherein the source region is arranged in a sidewall of the contact trench.

16. The semiconductor device according to claim 12, wherein the gate electrode is disposed at at least two sides of the ridge.

17. The semiconductor device according to claim 11, wherein the second ridge has a larger width than the width of the first ridge, the width being measured in a direction perpendicular to the first direction.

* * * * *